(12) United States Patent
Peng et al.

(10) Patent No.: US 8,499,510 B2
(45) Date of Patent: Aug. 6, 2013

(54) DATA CENTER

(75) Inventors: Wen-Tang Peng, Tu-Cheng (TW);
Yi-Liang Hsiao, Tu-Cheng (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 98 days.

(21) Appl. No.: 13/115,122

(22) Filed: May 25, 2011

(65) Prior Publication Data

US 2012/0255239 A1    Oct. 11, 2012

(30) Foreign Application Priority Data

Apr. 6, 2011    (TW) .................................. 100111844

(51) Int. Cl.
*E04C 2/52* (2006.01)
*A47B 81/00* (2006.01)
*A47B 97/00* (2006.01)
*F25D 23/12* (2006.01)
*F25D 23/02* (2006.01)

(52) U.S. Cl.
USPC ......... 52/220.1; 312/223.1; 62/259.2; 62/265

(58) Field of Classification Search
USPC ............... 52/220.1, 220.2, 27; 62/259.2, 265; 312/223.1; 361/690
See application file for complete search history.

(56) References Cited

U.S. PATENT DOCUMENTS

| | | | | |
|---|---|---|---|---|
| 4,874,127 A | * | 10/1989 | Collier | 236/49.5 |
| RE33,220 E | * | 5/1990 | Collier | 52/263 |
| 5,053,637 A | * | 10/1991 | Dillard | 307/147 |
| 5,345,779 A | * | 9/1994 | Feeney | 62/259.2 |
| 5,467,609 A | * | 11/1995 | Feeney | 62/259.2 |
| 5,806,948 A | * | 9/1998 | Rowan et al. | 312/293.3 |
| 6,129,434 A | * | 10/2000 | Melane et al. | 312/351.1 |
| 6,535,382 B2 | * | 3/2003 | Bishop et al. | 361/690 |
| 6,629,737 B2 | * | 10/2003 | Wiggins | 312/223.1 |
| 6,668,957 B2 | * | 12/2003 | King | 180/68.5 |
| 7,420,805 B2 | * | 9/2008 | Smith et al. | 361/679.48 |
| 7,492,575 B2 | * | 2/2009 | Irmer et al. | 361/608 |
| 7,878,888 B2 | * | 2/2011 | Rasmussen et al. | 454/184 |
| 8,238,104 B2 | * | 8/2012 | Salpeter | 361/716 |
| 8,257,155 B2 | * | 9/2012 | Lewis, II | 454/184 |
| 2002/0026753 A1 | * | 3/2002 | Ray | 52/27 |
| 2007/0171610 A1 | * | 7/2007 | Lewis | 361/691 |
| 2007/0220912 A1 | * | 9/2007 | Miyamoto et al. | 62/259.2 |
| 2007/0260417 A1 | * | 11/2007 | Starmer et al. | 702/136 |
| 2010/0154687 A1 | * | 6/2010 | Blumberg | 109/1 S |
| 2010/0302744 A1 | * | 12/2010 | Englert et al. | 361/730 |
| 2011/0023388 A1 | * | 2/2011 | Tong et al. | 52/173.1 |
| 2011/0045759 A1 | * | 2/2011 | Rasmussen et al. | 454/184 |
| 2011/0105010 A1 | * | 5/2011 | Day | 454/184 |
| 2011/0237174 A1 | * | 9/2011 | Felisi et al. | 454/184 |
| 2012/0060429 A1 | * | 3/2012 | Reynolds et al. | 52/19 |
| 2012/0129442 A1 | * | 5/2012 | Wei | 454/184 |

* cited by examiner

*Primary Examiner* — Ryan Kwiecinski

(74) *Attorney, Agent, or Firm* — Altis Law Group, Inc.

(57) ABSTRACT

A data center includes a server, a trestle-floor, and a battery box. The server is positioned on the trestle-floor. The battery box is located under the trestle-floor and below the server. The trestle-floor includes a number of tiles. The battery box receives a number of battery units. When the battery units need to be replaced or repaired, one or more tiles of the trestle-floor are operable to be removed to expose the battery units.

3 Claims, 3 Drawing Sheets

DATA CENTER

BACKGROUND

1. Technical Field

The present disclosure relates to a data center.

2. Description of Related Art

A data center usually includes a number of battery boxes for server modules. When battery boxes are arranged on the floor they use up too much space, however if they are stored in the server modules they are difficult to service or replace.

BRIEF DESCRIPTION OF THE DRAWINGS

Many aspects of the present embodiments can be better understood with reference to the following drawing. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Figure 1:
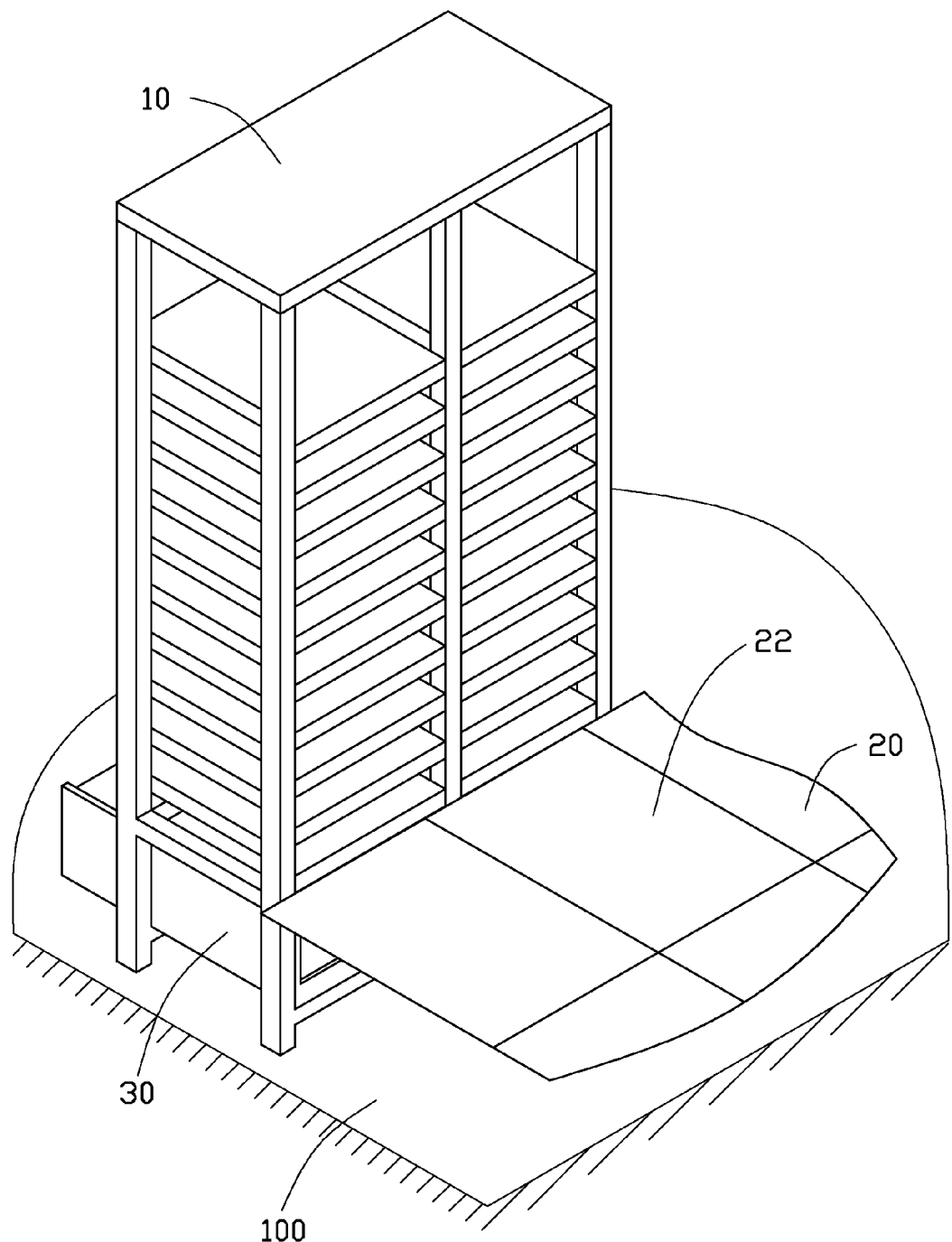
FIG. 1 is a schematic view of an embodiment of a data center.
Figure 2:
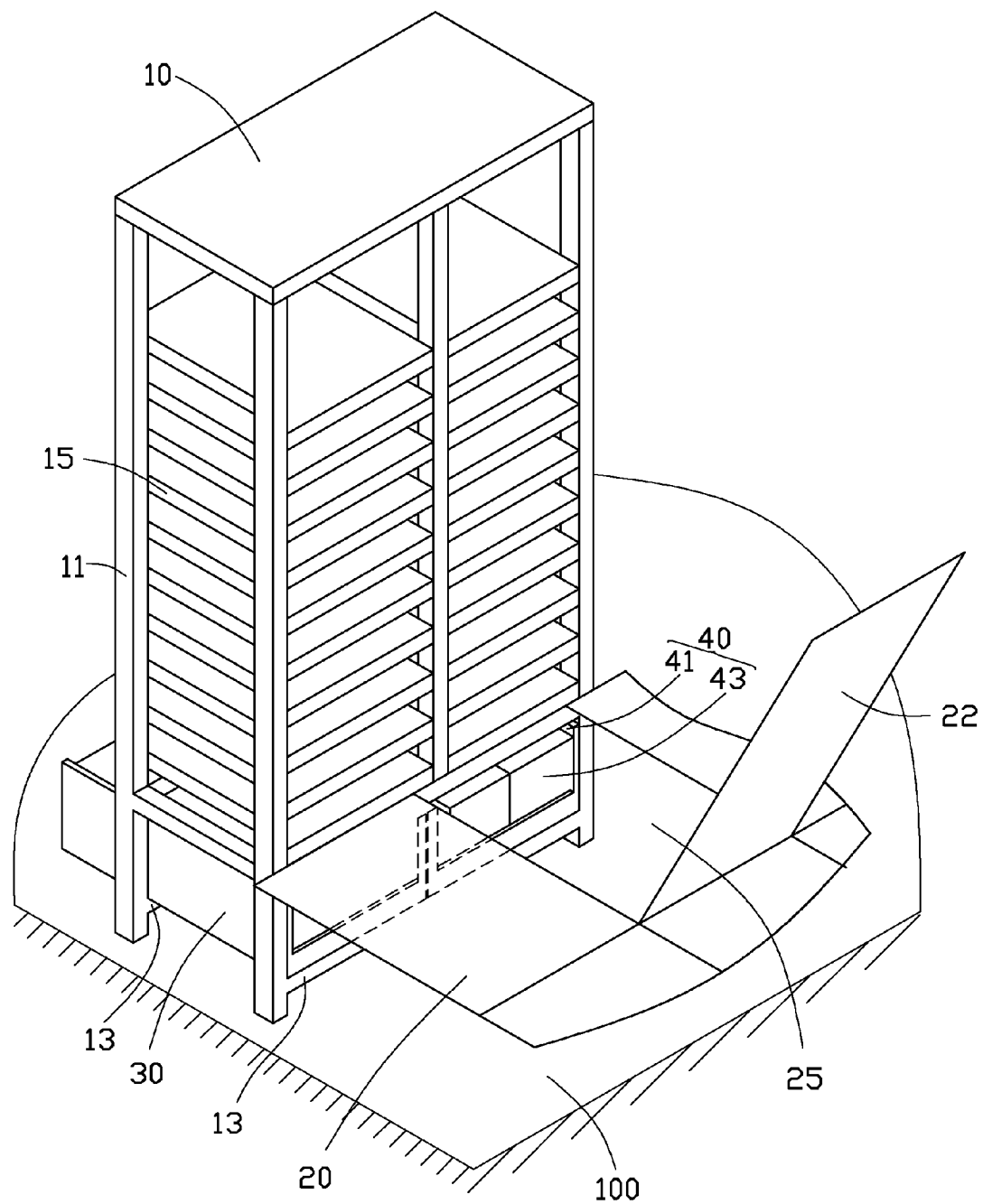
FIGS. 2 and 3 are schematic views of the data center, showing different states of use respectively.

Referring to the FIG. 1 and FIG. 2, an exemplary embodiment of a data center includes a floor 100, a cabinet server 10, a trestle-floor 20 set on the floor 100 and spaced from the floor 100, and a battery box 30.

The server 10 includes four upright supporting poles 11 standing on the floor 100, two horizontal connecting poles 13 respectively connecting two supporting poles 11, and a plurality of server units 15 received in the server 10 above the trestle-floor 20. The connecting poles 13 are parallel to each other and under the trestle-floor 20. The battery box 30 is located on the connecting poles 13, under the trestle-floor 20, and below the server units 15. The trestle-floor 20 includes a plurality of detachable tiles 22.

The battery box 30 receives a plurality of battery units 40. Each battery unit 40 includes a substantially U-shaped bracket 41 for receiving one or more batteries 43.

Figure 3:
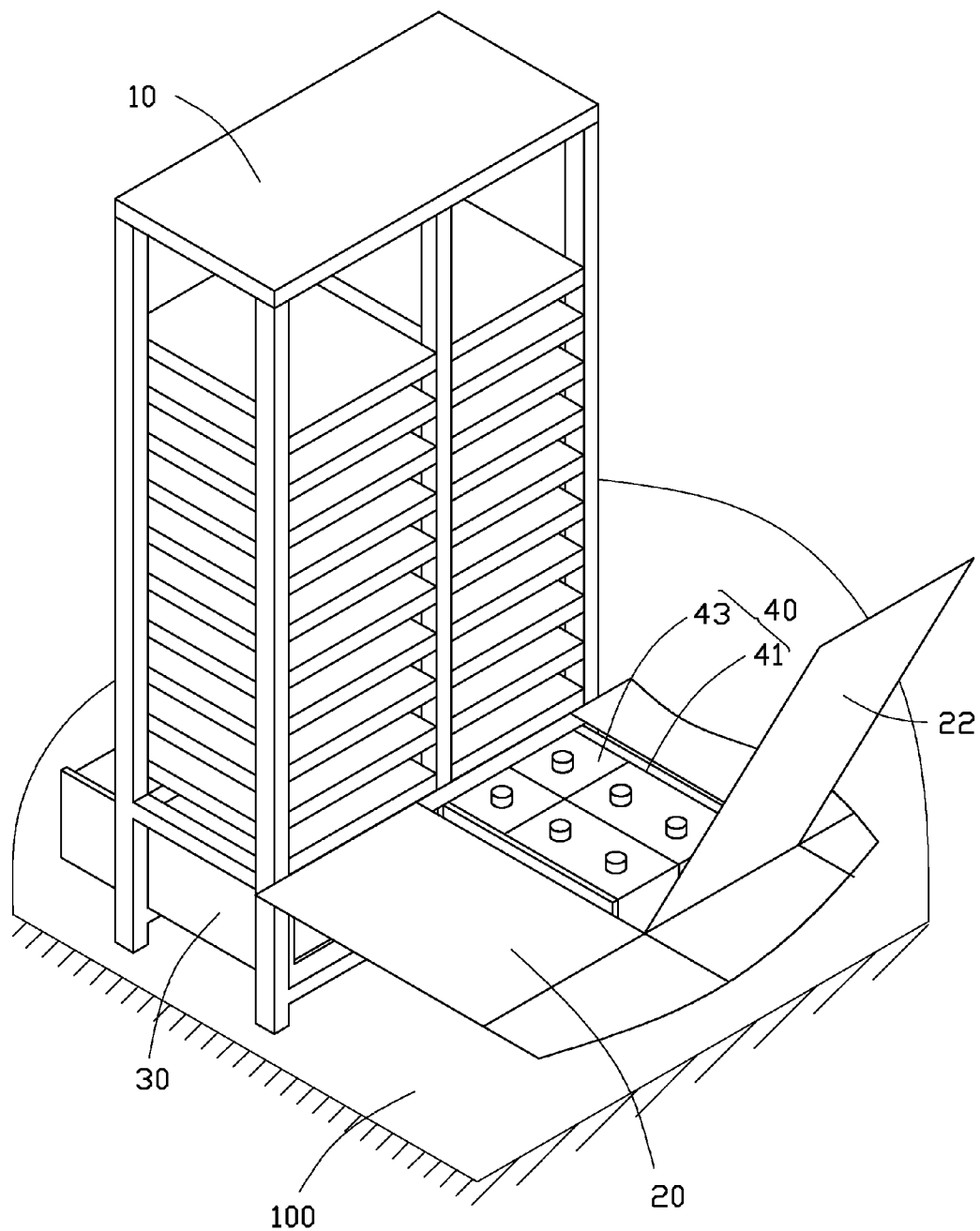

Referring to the FIG. 3, when the battery units 40 need to be replaced or repaired, one or more tiles 22 adjacent to the corresponding battery units 40 are removed to expose the battery units 40.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
a trestle-floor spaced above a floor, the trestle-floor comprising a plurality of detachable tiles;
a cabinet server comprising four upright supporting poles standing on the floor and extending up through the trestle floor wherein some of the plurality of detachable tiles are adjacent the cabinet server, two horizontal connecting poles, each of the two horizontal connecting poles connected between two of the four upright supporting poles and below the trestle-floor, and a plurality of server units above the trestle-floor; and
a battery box located on the two horizontal connecting poles under the trestle-floor and below the server units, the battery box receiving a plurality of battery units;
wherein the plurality of battery units are accessed to be replaced or repaired, by removing one or more of the plurality of detachable tiles adjacent to the cabinet server to form an opening in the trestle-floor, and the plurality of battery units are moved to align with the opening in the trestle-floor to be removed through the opening in the trestle floor.

2. The data center of claim 1, wherein each of the plurality of battery units comprises a substantially U-shaped bracket for receiving one or more batteries.

3. The data center of claim 1, wherein the two horizontal connecting poles are parallel to each other.

* * * * *